(12) United States Patent
Shi

(10) Patent No.: US 10,547,954 B2
(45) Date of Patent: Jan. 28, 2020

(54) MEMS MICROPHONE AND METHOD FOR MANUFACTURING THE SAME

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Hui Shi, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 4 days.

(21) Appl. No.: 15/918,256

(22) Filed: Mar. 12, 2018

(65) Prior Publication Data

US 2018/0262845 A1 Sep. 13, 2018

(30) Foreign Application Priority Data

Mar. 13, 2017 (CN) .......................... 2017 1 0148001

(51) Int. Cl.
*H04R 19/04* (2006.01)
*B81B 3/00* (2006.01)
*B81C 1/00* (2006.01)
*H04R 19/00* (2006.01)
*B81B 7/00* (2006.01)
*B81B 7/02* (2006.01)

(52) U.S. Cl.
CPC ............. *H04R 19/04* (2013.01); *B81B 3/007* (2013.01); *B81C 1/00658* (2013.01); *B81B 2201/0257* (2013.01); *B81B 2203/0127* (2013.01); *B81B 2203/0307* (2013.01); *B81B 2203/04* (2013.01); *B81C 2201/0114* (2013.01); *H04R 19/005* (2013.01); *H04R 2201/003* (2013.01)

(58) Field of Classification Search
None
See application file for complete search history.

(56) References Cited

U.S. PATENT DOCUMENTS

| | | | |
|---|---|---|---|
| 9,681,243 B2* | 6/2017 | Guo ....................... | B81B 3/0051 |
| 2013/0016859 A1* | 1/2013 | Buck ....................... | H04R 7/26 |
| | | | 381/174 |
| 2013/0177192 A1* | 7/2013 | Abry ....................... | H04R 1/08 |
| | | | 381/369 |
| 2014/0233782 A1* | 8/2014 | Bolognia ................. | H04R 1/04 |
| | | | 381/360 |

(Continued)

*Primary Examiner* — Qin Zhu
(74) *Attorney, Agent, or Firm* — Kilpatrick Townsend & Stockton LLP

(57) ABSTRACT

A microphone includes a substrate, an opening in the substrate, and a support structure in the opening. The support structure includes a first bracket formed in a closed-loop pattern and a second bracket connecting the first bracket to a periphery of the opening. The support structure in the opening increases the mechanical reliability of the microphone.

20 Claims, 4 Drawing Sheets

(56) References Cited

U.S. PATENT DOCUMENTS

| | | | |
|---|---|---|---|
| 2015/0230027 A1* | 8/2015 | Inoue | H04R 19/00 |
| | | | 381/191 |
| 2016/0192082 A1* | 6/2016 | Uchida | H04R 19/005 |
| | | | 257/416 |
| 2017/0201192 A1* | 7/2017 | Tumpold | H01L 41/081 |
| 2017/0289703 A1* | 10/2017 | Bartl | B81C 1/00158 |
| 2017/0355591 A1* | 12/2017 | Hedenig | B81B 3/0021 |
| 2018/0002167 A1* | 1/2018 | Frischmuth | B81B 3/007 |
| 2018/0007473 A1* | 1/2018 | Cargill | B81B 3/0072 |
| 2018/0035228 A1* | 2/2018 | Boyd | B81B 3/0021 |
| 2018/0035229 A1* | 2/2018 | Deas | B81B 3/0021 |
| 2018/0091881 A1* | 3/2018 | Evans | H04R 1/08 |
| 2018/0115836 A1* | 4/2018 | Hsieh | H04R 19/04 |
| 2018/0208454 A1* | 7/2018 | Hoekstra | B81B 3/0029 |

\* cited by examiner

MEMS MICROPHONE AND METHOD FOR MANUFACTURING THE SAME

CROSS-REFERENCES TO RELATED APPLICATIONS

The present application claims priority to Chinese patent application No. 201710148001.4, filed with the State Intellectual Property Office of People's Republic of China on Mar. 13, 2017, the content of which is incorporated herein by reference in its entirety.

FIELD OF INVENTION

The present invention relates to semiconductor technology, and more particularly to a MEMS microphone and a method for manufacturing the same.

BACKGROUND OF THE INVENTION

In the field of electro-acoustic products, the microphone is a sensor that converts acoustic energy into electrical energy. A capacitive micro-electro-mechanical system (MEMS) microphone generally includes a vibration membrane, a fixed plate (back plate), and a cavity between the vibration membrane and the fixed plate. A capacitive MEMS microphone enables detection of a capacitive value change due to the displacement of the vibration membrane caused by a change in the acoustic pressure, and the detected capacitive value change is then converted to an electrical signal for processing.

Comparing to conventional microphones, MEMS microphones are less sensitive to temperature, vibration, humidity and have better mechanical stability. For example, MEMS microphones can withstand high reflow temperature of about 260° C., and the MEMS microphones do not have obvious change in performance.

With continuous development in technology and the growing demand, MEMS microphones are not only expected to provide better acoustic performance, but also to provide better mechanical stability in order to be able to resist deformation during transport and in post-working without damage that may be caused by cracks.

In order to ensure the mechanical reliability and stability of a microphone, a microphone generally needs to satisfy the air pressure test (APT) and the drop test. The air pressure test is performed after the microphone has been packaged. Air is introduced to the microphone from the top or from the bottom of the microphone to test the maximum pressure that the microphone can withstand. Air introduced from the top side of the microphone to test the air pressure is called top-side air pressure test, and air introduced from the bottom side of the microphone to test the air pressure is called bottom-side air pressure test. Drop test is referred to the percentage of microphones that survive without suffering damage after being dropped from a certain height (e.g., 1 meter) onto a floor made of a certain material (e.g., a marble floor).

FIG. 1 shows a structure of a lower electrode plate (vibration membrane) 101 of a MEMS microphone. Lower electrode plate 101 has a middle square portion 111 that can vibrate and is mounted to a semiconductor structure by four anchors 121. The semiconductor structure has an opening in the backside of a substrate that operates as an acoustic channel for collecting sound. In current designs, the size of the opening is substantially equal to the size of middle square portion 111 of the lower electrode plate.

BRIEF SUMMARY OF THE INVENTION

The present inventor has discovered that conventional MEMS microphones do not satisfy the air pressure test and the drop test, and have poor mechanical reliability. The present inventor provides in the disclosure a novel technical solution that can improve the mechanical reliability of MEMS microphones.

According to embodiments of the present invention, a microphone includes a substrate, an opening in the substrate, a support structure in the opening. The support structure includes a first bracket having a closed-loop pattern and a second bracket that connects the first bracket with a periphery of the opening.

In one embodiment, a cross-sectional area of the opening has a square-like shape including at least one curved corner. In one embodiment, the square-like shape includes four curved corners.

In one embodiment, the at least one curved corner includes an arc of a circle which has a radius equal to a length of the arc. In one embodiment, the radius of the circle is in a range between 270 μm and 330 μm.

In one embodiment, the closed-loop pattern of the first bracket includes one of a circular pattern, an oval pattern, a prismatic pattern, a spare pattern, or a triangular pattern.

In one embodiment, the second bracket includes at least two portions spaced apart from each other, the at least two portions divide an area between the first bracket and the periphery of the opening into a same number of regions. In one embodiment, the regions have a same surface area.

In one embodiment, the second bracket includes four portions.

In one embodiment, the microphone further includes a first electrode plate disposed on the opening, the first electrode layer includes a square vibration portion and a fixed portion that extends outwardly from at least one of the four corners of the square vibration portion.

In one embodiment, the microphone further includes a second electrode plate disposed above the first electrode plate and spaced apart from the first electrode plate.

Embodiments of the present invention also provide a method for manufacturing a microphone. The method may includes the following steps: providing a substrate having a top surface and a bottom surface, forming a patterned mask on the bottom surface of the substrate, the patterned mask defining a shape of an opening, etching the substrate using the patterned mask as a mask to form the opening. The opening thus formed includes a support structure having a first bracket formed in a closed-loop pattern and a second bracket connecting the first bracket to a periphery of the opening.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1:
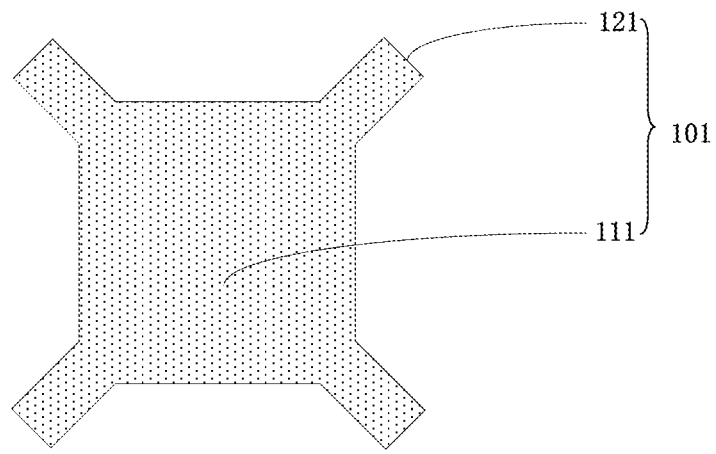
FIG. 1 shows a schematic plan view of the structure of a lower electrode of a conventional MEMS microphone.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

Embodiments of the invention are described herein with reference to cross-section illustrations that are schematic illustrations of idealized embodiments (and intermediate structures) of the invention.

It should be noted that like reference numerals are used to denote like elements, and once an element has been defined in a drawings, it will not be further described in other drawings.

The present inventor has studied the problem of poor mechanical reliability and stability of MEMS microphones and discovered that the four anchors of the lower electrode of the microphone are easily broken. The present inventor provides the following solution to solve the poor mechanical reliability of MEMS microphones.

Figure 2:
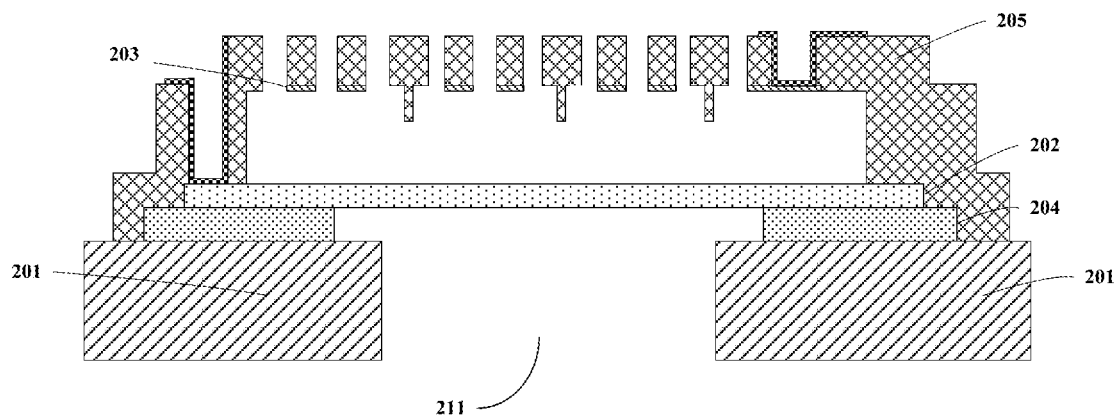
FIG. 2 shows a schematic cross-sectional view of a structure of a MEMS microphone according to an embodiment of the present invention.

FIG. 2 shows a longitudinal cross-sectional view of a structure of a MEMS microphone according to an embodiment of the present invention. The microphone includes a substrate 201, a first electrode plate 202 on substrate 201, and a second electrode plate 203 on first electrode plate 202 and spaced apart from first electrode plate 202. First electrode plate 202 and second electrode plate 203 each may include polysilicon. In one embodiment, referring to FIG. 3, first electrode plate 202 may include a square vibration portion 212 and a fixed portion 222 extending outwardly from at least one of the four corners of square vibration portion 212.

Substrate 201 has an opening 211 operable as an acoustic channel for collecting sound. First electrode plate 202 is disposed on opening 211. Further, the microphone may include an insulating portion 204 (e.g., silicon oxide) disposed between first electrode plate 202 and substrate 201, and a support layer 205 (e.g., silicon nitride) operable to support second electrode plate 203.

According to embodiments of the present invention, support layer 205 has a support structure that includes a first bracket having a closed-loop pattern and a second bracket for connecting the first bracket with the peripheral edges of opening 211. When first electrode plate 202 vibrates downwardly, the support structure can counteract a portion of the force, thereby reducing the force applied to fixed portion 222 and improving the mechanical reliability of the microphone.

Figure 4:
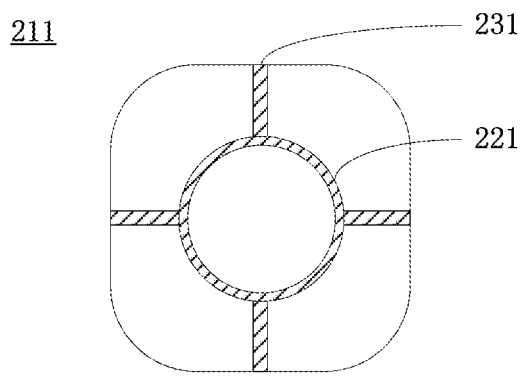
FIG. 4 shows a lateral cross-sectional view of an opening shown in FIG. 2 according to an embodiment of the present invention.

FIG. 4 shows a lateral cross-sectional view of an embodiment of the opening shown in FIG. 2. As shown in FIG. 4, the cross-sectional shape of opening 211 may be a square having at least one curved corner. In one embodiment, the curved corner has the shape of an arc of a circle, i.e., the length of the arc (the curved corner) is equal to the radius of the circle. In one embodiment, the radius of the circle is half of the width (or length) of the square first bracket. The support structure includes a first bracket 221 that has a closed-loop pattern and a second bracket 231 for connecting first bracket 221 to peripheral edges of opening 211.

Figure 3:
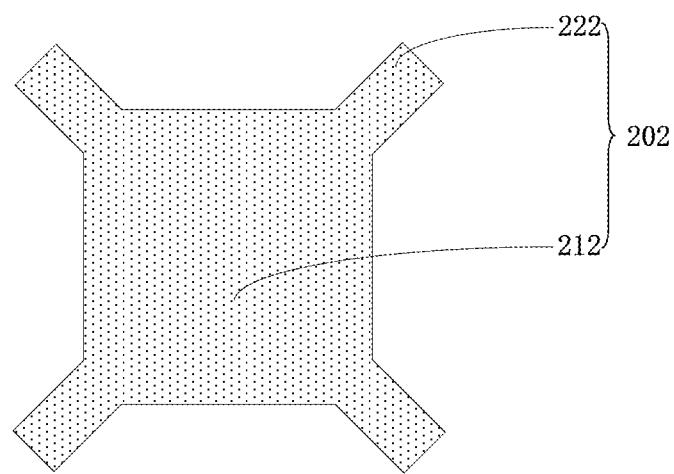
FIG. 3 shows a schematic plan view of the structure of a first electrode plate according to an embodiment of the present invention.
Figure 5:
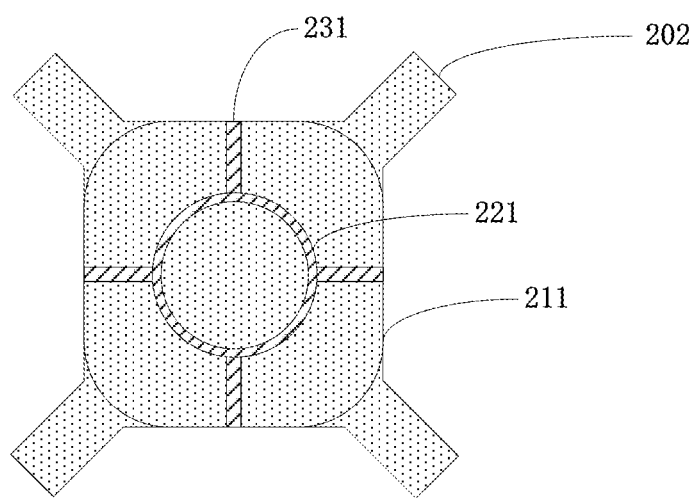
FIG. 5 shows a schematic plan view of an example of the relationship between the opening shown in FIG. 4 and the first electrode plate in FIG. 3.

FIG. 5 shows a schematic view of an example of the relationship between the opening shown in FIG. 4 and the first electrode plate shown in FIG. 3. Referring to FIG. 5, the lateral cross-sectional surface area of opening 211 is smaller than the lateral cross-sectional surface area of the square vibration portion of first electrode plate 202. In the case where the cross-sectional shape of opening 211 is a square, when the vibration portion of first electrode plate vibrates downwardly, the surface area for receiving a force of first electrode plate 202 is larger, so that the stress applied to fixed portion 222 is reduced, fixed portion 222 is not prone to crack, thereby improving the mechanical reliability of the microphone. In one embodiment, referring to FIGS. 4 and 5, the square-like shape of the opening has four curved corners in order to further improve the mechanical reliability of the microphone. In one embodiment, a curved corner of the square-like opening has a curvature of an arc having a length substantially equal to the radius of a circle. In a specific embodiment, the radius of the circle is in the range between 270 μm and 330 μm, e.g., 280 μm, 300 μm, or 320 μm.

In one embodiment, the support structure (which includes first bracket 221 and second bracket 231) in opening 211 has the same material as that of substrate 201. Further, in the case where the opening has a square-like shape, the radian (arc) portion of opening is disposed at a location corresponding to a corner of square vibration portion 212 of first electrode plate 202.

It should be noted that, although FIGS. 4 and 5 show the closed-loop pattern of first bracket 221 has a circular shape, however, the scope of the present invention is not limited thereto. In some other embodiments, the closed-loop pattern of first bracket 221 may have other shapes, e.g., oval, prismatic, square (including rectangular), or triangular shapes.

It also should be noted that, although FIGS. 4 and 5 show second bracket 231 as including four spaced apart portions, however, the scope of the present invention is not limited thereto. In some other embodiments, second bracket 231 may include at least two spaced apart portions, e.g., two portions, three portions, five or more portions. At least two portions of second bracket 231 divide the area between first bracket 221 and the periphery of opening 211 into a same number of regions. In one embodiment, each of the divided regions has the same surface area to improve the mechanical reliability and stability of the microphone.

Figure 6A:
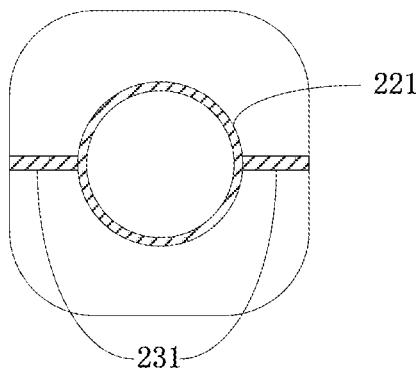
FIG. 6A shows a lateral cross-sectional view of the opening shown in FIG. 2 according to another embodiment of the present invention.

FIG. 6A shows a lateral cross-sectional view of the opening shown in FIG. 2 according to another embodiment of the present invention. In this embodiment, second bracket 231 includes two spaced apart portions that divide the area between first bracket 221 and the periphery of opening 211 into two regions. In one embodiment, the two regions have the same surface area.

Figure 6B:
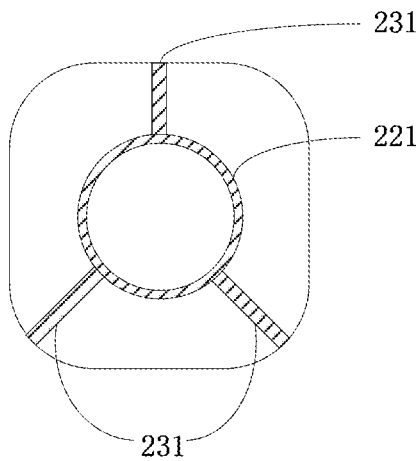
FIG. 6B shows a lateral cross-sectional view of the opening shown in FIG. 2 according to yet another embodiment of the present invention.

FIG. 6B shows a cross-sectional view of the opening shown in FIG. 2 according to yet another embodiment of the present invention. In this embodiment, second bracket 231 includes three spaced apart portions that divide the area between first bracket 221 and the periphery of opening 211 into three regions. In one embodiment, the three regions have the same surface area.

It will be appreciated that those of skill in the art may select the shape of the enclosed-loop pattern of first bracket 221 and the number of portions in second bracket 231 according to actual design requirements to obtain different mechanical reliability of the microphone.

The microphone having the above-described opening can be manufactured using different manufacturing methods. An exemplary manufacturing method will be described below with reference to FIG. 7.

Figure 7:
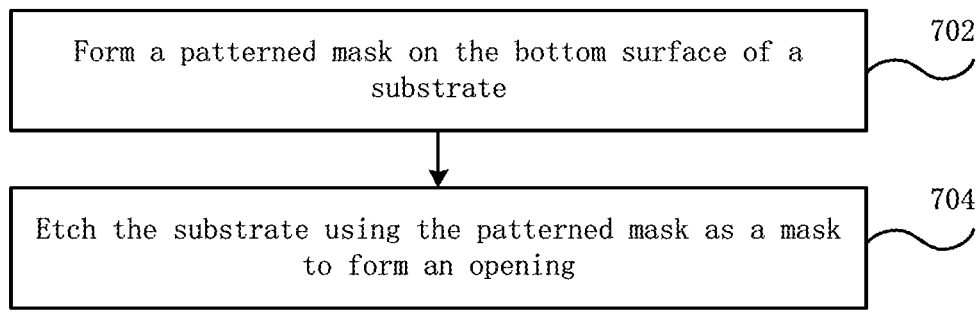
FIG. 7 is a simplified flowchart illustrating a method for manufacturing a MEMS microphone according to an embodiment of the present invention.

FIG. 7 is a simplified flowchart of a method for manufacturing a microphone according to an embodiment of the present invention. Referring to FIG. 7, the method includes the steps of manufacturing an opening in a substrate of a microphone, the opening is operable as an acoustic channel to collect sound. The method may include:

Step 702: providing a substrate having a top surface and a bottom surface, and forming a patterned mask, e.g., a photoresist, on the bottom surface of the substrate, the patterned mask defines the shape of an opening.

For example, a mask having a shape of an opening may be designed, a photoresist on the bottom surface of the substrate may be exposed and developed using the mask to form a patterned photoresist.

Step 704: performing an etch process on the substrate using the patterned photoresist as a mask to form an opening. The opening thus formed includes a support structure that includes a first bracket having a closed-loop pattern and a second bracket for connecting the first bracket with the periphery of the opening. The first bracket and the second bracket may be of the same material. Further, the first bracket and the second bracket may have the same height that is equal to the thickness of the substrate.

The closed-loop pattern of the first bracket may have a circular, oval, square (including rectangular), or triangular shape. In one embodiment, the second bracket includes at least two portions (e.g., four spaced apart portions) that are spaced apart from each other. The at least two portions of the second bracket divide the area between the first bracket and the periphery of the opening into the same number of regions. In other words, when the second bracket has four portions, the number of divided areas between the first bracket and the opening periphery will be four areas. In one embodiment, the regions that are divided by the portions of the second bracket have the same area.

In the embodiment, the manufacturing method of a microphone having the above-described opening only requires a change of a mask layer without requiring any additional process steps, so that the manufacturing method of the present invention is well suitable for mass production of microphones with no additional production costs and improved mechanical reliability.

It should be noted that the manufacturing method shown in FIG. 7 may also include steps for manufacturing other components, such as the first electrode plate and the second electrode plate. Since the manufacturing process of the opening is the focus of the present invention, the detailed description of other process steps will be omitted herein for the sake of brevity.

In one embodiment, the lateral cross-sectional view of the opening has a square-like shape, where the square-like shape is a square having at least one curved corner. In one embodiment, the curved corner has an arc of a circle that has the radius of the length of the arc. The circle radius is equal to half of the maximum width or length of the opening. In one embodiment, the square-like opening has four curved corners. In one embodiment, the radius of the circle is in the range between 270 μm and 330 μm, e.g., 280 μm, 300 μm, or 320 μm.

The microphone thus manufactured according to embodiments of the present invention shows better results in APT and drop tests.

Figure 8:
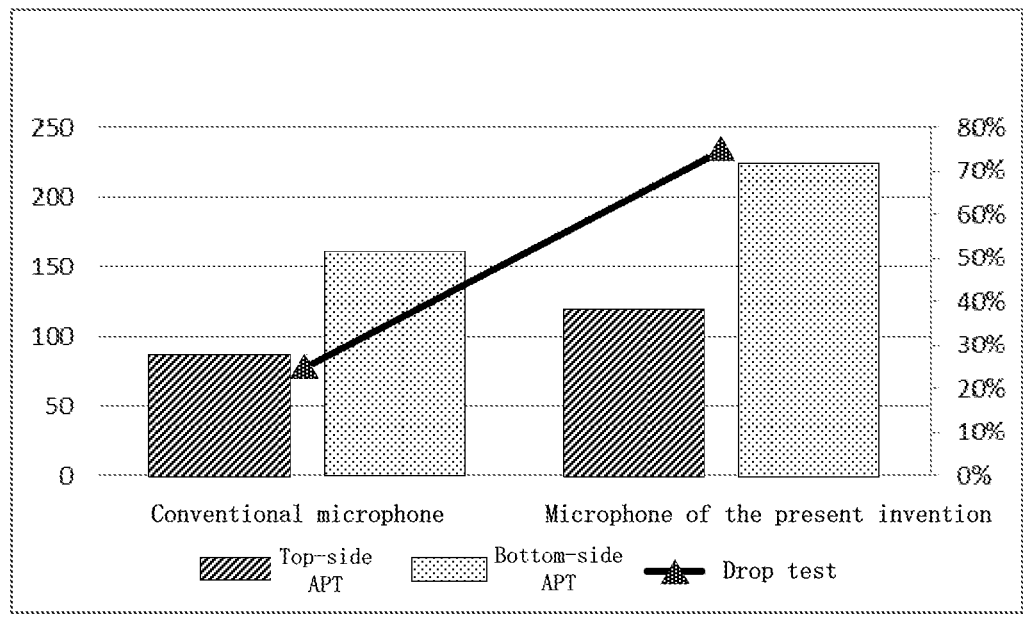
FIG. 8 shows a comparison of the APT (air pressure test) and drop test results between a conventional microphone and a microphone manufactured according to some embodiments of the present invention.

FIG. 8 shows a comparison of the APT and drop test results between a conventional microphone and a microphone manufactured according to an embodiment of the present invention. Referring to FIG. 8, the microphone of the present invention is shown to be able to withstand higher pressure (top-side or bottom-side APT) than a conventional microphone. In addition, the drop test survivability of the microphone of the present invention is significantly higher than that of a conventional microphone. Thus, it can be seen that the microphone according to embodiments of the present invention can effectively improve the mechanical reliability.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A microphone, comprising:
   a substrate;
   an opening in the substrate; and
   a support structure in the opening and comprising a first bracket formed in a closed-loop pattern and a second bracket connecting the first bracket to a periphery of the opening,
   wherein the second bracket comprises at least two portions spaced apart from each other, the at least two portions dividing an area between the first bracket and the periphery of the opening into a same number of regions.

2. The microphone of claim 1, wherein a cross-sectional area of the opening has a square-like shape including at least one curved corner.

3. The microphone of claim 2, wherein the square-like shape comprises four curved corners.

4. The microphone of claim 2, wherein the at least one curved corner comprises an arc of a circle having a radius equal to a length of the arc.

5. The microphone of claim 4, wherein the radius of the circle is in a range between 270 μm and 330 μm.

6. The microphone of claim 1, wherein the closed-loop pattern of the first bracket comprises a circular pattern, an oval pattern, a prismatic pattern, a square pattern, or a triangular pattern.

7. The microphone of claim 1, wherein the regions have a same surface area.

8. The microphone of claim 7, wherein the second bracket comprises four portions.

9. The microphone of claim 1, further comprising:
   a first electrode plate on the opening, the first electrode plate comprising a square vibration portion and a fixed portion extending outwardly from at least one of four corners of the square vibration portion.

10. The microphone of claim 9, further comprising:
    a second electrode plate above the first electrode plate and spaced apart from the first electrode plate.

11. The microphone of claim 1, wherein the second bracket comprises three portions.

12. A method for manufacturing a microphone, comprising:
    providing a substrate having a top surface and a bottom surface;
    forming a patterned mask on the bottom surface of the substrate, the patterned mask defining a shape of an opening; and
    etching the substrate using the patterned mask as a mask to form the opening, the opening comprising a support structure having a first bracket formed in a closed-loop pattern and a second bracket connecting the first bracket to a periphery of the opening,
    wherein the second bracket comprises at least two portions spaced apart from each other, the at least two portions dividing an area between the first bracket and the periphery of the opening into a same number of regions.

13. The method of claim 12, wherein a cross-sectional area of the opening has a square-like shape including at least one curved corner.

14. The method of claim 13, wherein the square-like shape comprises four curved corners.

15. The method of claim 13, wherein the at least one curved corner comprises an arc of a circle having a radius equal to a length of the arc.

16. The method of claim 15, wherein the radius of the circle is in a range between 270 μm and 330 μm.

17. The method of claim 12, wherein the closed-loop pattern of the first bracket comprises a circular pattern, an oval pattern, a prismatic pattern, a square pattern, or a triangular pattern.

18. The method of claim 12, wherein the regions have a same surface area.

19. The method of claim 12, wherein the second bracket comprises four portions.

20. The method of claim 12, wherein the second bracket comprises three portions.

\* \* \* \* \*